(12) United States Patent  (10) Patent No.: US 8,598,955 B2
Xue  (45) Date of Patent: Dec. 3, 2013

(54) PHASE LOCKED LOOP WITH ADAPTIVE LOOP FILTER

(75) Inventor: Dashun Xue, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/435,089

(22) Filed: Mar. 30, 2012

(65) Prior Publication Data

US 2013/0257546 A1  Oct. 3, 2013

(51) Int. Cl.
 *H03L 7/00* (2006.01)

(52) U.S. Cl.
 USPC .............. 331/16; 331/17; 327/156; 327/157

(58) Field of Classification Search
 USPC .................... 331/16, 17, 57; 327/156–158
 See application file for complete search history.

(56) References Cited

U.S. PATENT DOCUMENTS

| | | | |
|---|---|---|---|
| 5,339,050 A * | 8/1994 | Llewellyn | 331/16 |
| 5,594,392 A * | 1/1997 | Kondoh et al. | 331/57 |
| 6,614,287 B1 * | 9/2003 | Gauthier et al. | 327/362 |
| 6,693,496 B1 | 2/2004 | Lebouleux | |
| 6,963,232 B2 | 11/2005 | Frans et al. | |
| 7,135,900 B2 | 11/2006 | Sohn | |
| 7,248,086 B2 | 7/2007 | Frans et al. | |
| 7,812,650 B2 | 10/2010 | Song et al. | |
| 8,149,032 B2 * | 4/2012 | Vlasenko et al. | 327/157 |
| 2004/0108905 A1 * | 6/2004 | Mason | 331/17 |
| 2004/0169563 A1 * | 9/2004 | Abbasi et al. | 331/160 |
| 2005/0035797 A1 | 2/2005 | Frans et al. | |
| 2005/0068073 A1 | 3/2005 | Shi et al. | |
| 2006/0119404 A1 | 6/2006 | Yeh | |
| 2007/0159264 A1 | 7/2007 | Jung et al. | |
| 2007/0188203 A1 | 8/2007 | Kimura et al. | |
| 2008/0186066 A1 | 8/2008 | Jung et al. | |
| 2009/0160510 A1 | 6/2009 | Song et al. | |
| 2009/0160560 A1 | 6/2009 | Song et al. | |
| 2012/0051480 A1 | 3/2012 | Usugi et al. | |
| 2012/0119801 A1 | 5/2012 | Hsieh et al. | |
| 2012/0126866 A1 | 5/2012 | Hsieh et al. | |

(Continued)

OTHER PUBLICATIONS

Maneatis, John G. "Low-Jitter Process-Independent DLL and PLL Based on Self-Biased Techniques." IEEE Journal of Solid-State Circuits, vol. 31, No. 11, Nov. 1996, pp. 1723-1732.

(Continued)

*Primary Examiner* — Joseph Chang
*Assistant Examiner* — Jeffrey Shin
(74) *Attorney, Agent, or Firm* — Gary Stanford

(57) ABSTRACT

A PLL including an adaptive loop filter. The PLL includes a feedback circuit which provides a feedback signal based on an output signal and a phase detector generating an adjust signal based on a frequency of the feedback signal compared with a reference frequency. A charge pump receives the adjust signal and provides a control voltage. The adaptive loop filter includes a capacitor and an adaptive resistance with a current control input. A VCO has an output providing the output signal based on a voltage level of the control voltage. A bias generator converts the control voltage to a loop bias current, and has a bias output based on the loop bias current coupled to the current control input of the adaptive resistance. The bias output of the bias generator may also be used to control the charge current and the VCO using currents proportional to the loop bias current.

17 Claims, 3 Drawing Sheets

(56) References Cited

U.S. PATENT DOCUMENTS

2012/0153999 A1  6/2012  Kim
2012/0223752 A1  9/2012  Huang et al.
2012/0223753 A1  9/2012  Moore
2012/0235718 A1  9/2012  Thakur et al.

OTHER PUBLICATIONS

Sidiropoulos, Stefanos et al. "Adaptive Bandwidth DLLs and PLLs using Regulated Supply CMOS Buffers" 2000 Symposium on VLSI Circuits Digest of Technical Papers. 2000 IEEE pp. 124-127.

* cited by examiner

PHASE LOCKED LOOP WITH ADAPTIVE LOOP FILTER

BACKGROUND OF THE INVENTION

1. Field of the Invention

The present invention relates generally to phase locked loops, and more particularly to a phase locked loop topology with an adaptive loop filter for improved performance.

2. Description of the Related Art

A conventional phase locked loop (PLL) includes a phase frequency detector (PFD), a charge pump (CP), a loop filter, a voltage-controlled oscillator (VCO), and a frequency divider. The loop filter normally includes a resistor in series with a capacitor. The loop gain and damping ratio typically characterize PLL performance. For a conventional PLL, the charge pump current, the VCO gain and the loop filter resistance are fixed so that it has a fixed damping ratio and a fixed loop gain.

The loop gain of the PLL should be set as close as possible to its operating frequency in order to minimize jitter of the PLL. The loop gain, however, is affected by many factors, such as, for example, process technology factors, voltage and temperature variations, and noisy environments. Conventional PLLs, therefore, have relatively narrow operating frequency range and poor jitter performance.

Existing solutions have proposed methods to make the damping ratio and the tracking bandwidth constant, where the tracking bandwidth is the ratio of loop bandwidth to PLL operating frequency. In one method, the loop filter resistor is implemented by an amplifier and set to be inversely proportional to the square root of charge pump current. Thus, the VCO frequency and the PLL loop bandwidth are also set to be proportional to the square root of charge pump current so that the ratio of loop bandwidth and PLL operating frequency is constant.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

A PLL should be able to meet stability constraints under worst case conditions, so that the loop gain is normally set at the lowest operating frequency applicable for the worst case conditions, rather than being set for optimized performance. In existing solutions, an additional amplifier and one or more charge pumps are added to generate the equivalent resistance. Such solutions disadvantageously increase power consumption, circuit complexity and circuitry area.

A phase locked loop (PLL) topology according to one embodiment as described herein is configured with an adaptive loop filter to achieve a constant damping ratio and a constant tracking bandwidth. The PLL topology with the adaptive loop filter thus has a wider operating frequency range and improved jitter performance as compared to conventional configurations. Compared to other existing solutions, the PLL with an adaptive loop filter as described herein also exhibits lower power operation, reduced silicon area consumption, and reduced circuit complexity. In one embodiment, the adaptive loop filter includes a capacitor and a first MOS device biased in its triode region to develop an equivalent loop filter resistance. The first MOS device is driven by another diode-coupled MOS transistor which is biased by a bias generator, which also provides bias current for the VCO and the charge pump.

Figure 1:
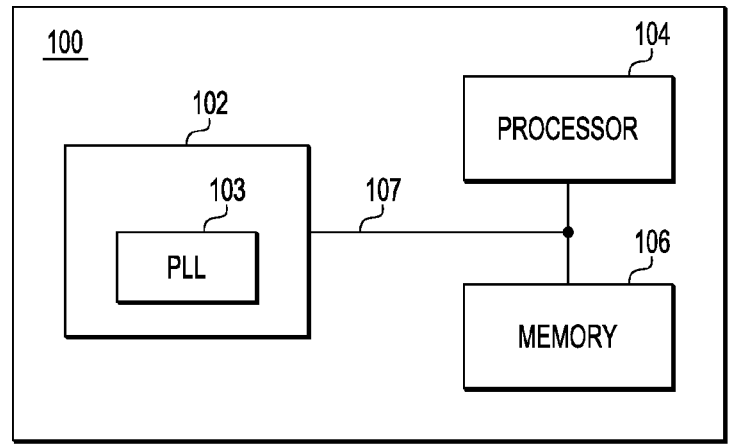
FIG. 1 is a simplified block diagram of an electronic system including a PLL implemented according to one embodiment.

FIG. 1 is a simplified block diagram of an electronic system 100 including a PLL 103 implemented according to one embodiment. The electronic system 100 includes a timing block 102, a processor block 104, and a memory block 106 coupled together by a system interface 107. Although not shown, additional devices and systems and/or sub-systems may be included, such as a power system and an input/output (I/O) system and the like. The processor block 104 may include one or more processing devices or microprocessors or the like. The memory block 106 may be implemented according to any suitable memory type with one or more memory devices, such as random access memory (RAM) devices and/or read-only memory (ROM) devices or the like. The system interface 107 may be implemented in any suitable manner to enable communications between the timing block 102, the processor block 104 and the memory block 106, such as any type of bus structure, switch structure, switch fabric, network structure, etc. The timing block 102 incorporates the PLL 103 and may be used to generate one or more oscillating signals or clock signals or the like for use by other components or devices in the system.

The electronic system 100 may be implemented as a system-on-chip (SOC) or as an embedded processing system or the like. Alternatively, the electronic system 100 may be implemented in a discrete manner in which the timing block 102, the processor block 104 and the memory block 106 may each be implemented on a separate integrated circuit (IC) or otherwise include any combination of one or more ICs or semiconductor chips or the like. The timing block 102, for example, may be integrated on a separate IC incorporating the PLL 103. The electronic system 100 may be configured for any type of application, such as communication systems, computer systems, sensing devices, etc., and for any one or more of consumer, industrial, commercial, computing, and/or automotive fields.

Figure 2:
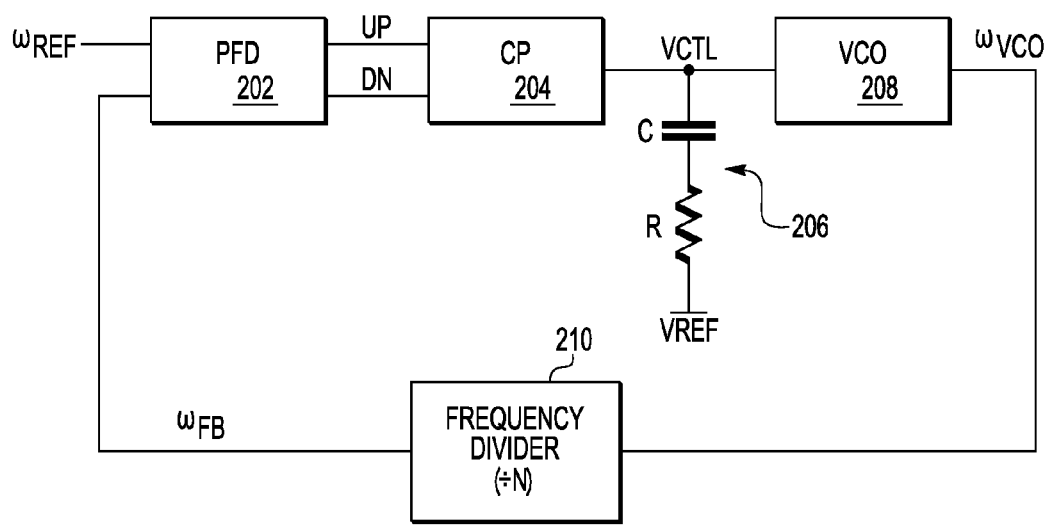
FIG. 2 is a simplified block and schematic diagram of a conventional PLL.

FIG. 2 is a simplified block and schematic diagram of a conventional PLL 200. The conventional PLL 200 includes a phase frequency detector (PFD) 202, a charge pump (CP) 204, a loop filter 206, a voltage controlled oscillator (VCO) 208, and a feedback circuit shown as a frequency divider 210. The PFD 202 receives a reference frequency signal $\omega_{REF}$ and a feedback frequency signal $\omega_{FB}$ and outputs an up (UP) signal and a down (DN) signal. The UP and DN signals are provided to respective inputs of a charge pump 204, which generates a control voltage VCTL filtered by the loop filter 206. In the illustrated embodiment, the loop filter 206 includes a loop filter capacitor C and a loop filter resistor R coupled in series between VCTL and a reference node VREF, which may be any positive or negative or ground voltage level. VCTL is also provided to an input of the VCO 204, having an output providing an output frequency signal $\omega_{VCO}$ at an output of the PLL 200. The output frequency signal $\omega_{VCO}$ has a frequency which is proportional to the voltage level of VCTL. The output frequency signal $\omega_{VCO}$ is fed back to an input of the frequency divider 210, in which the frequency divider 210 generates the feedback frequency signal $\omega_{FB}$ fed back to an input of the PFD 202. The frequency divider 210 divides the frequency of the output frequency $\omega_{VCO}$ by a suitable frequency divider ratio N (e.g., ÷N) to control the frequency of the feedback frequency signal $\omega_{FB}$. N may be an integer, but is not limited an integer value.

The PFD 202 compares the phase and frequency of $\omega_{REF}$ and $\omega_{FB}$ and outputs the UP and DN signals to adjust phase and frequency of $\omega_{FB}$ in an attempt to match that of $\omega_{REF}$. The UP and DN signals are adjust signals in which a single adjust signal may be used in an alternative embodiment. The CP 204 generally operates to charge and discharge the capacitor C of the loop filter 206 based on the UP and DN signals to adjust VCTL accordingly. The VCO 208 correspondingly adjusts the output frequency signal $\omega_{VCO}$ based on VCTL, which is divided down by the voltage divider 210 to develop the feedback frequency signal $\omega_{FB}$. In this manner, the PLL 200 generally operates to generate $\omega_{VCO}$ such that $\omega_{VCO}=N\cdot\omega_{REF}$.

The conventional PLL 200 has several deficiencies, including relatively narrow operating frequency range and poor jitter performance. If the PLL 200 is used as the PLL 103 of the electronic system 100, then the overall performance of the electronic system 100 may be compromised. Jitter is an undesired deviation of the desired frequency of $\omega_{VCO}$ which leads to a distorted output. The jitter is typically random and unpredictable which affects the overall accuracy of the signals using or otherwise based on the output frequency signal $\omega_{VCO}$. As an example, if the output of the PLL 200 is used as or otherwise used to generate a sampling clock signal for an analog to digital converter (ADC) (not shown), then the overall accuracy and performance of the ADC is compromised by the undesired jitter.

Figure 3:
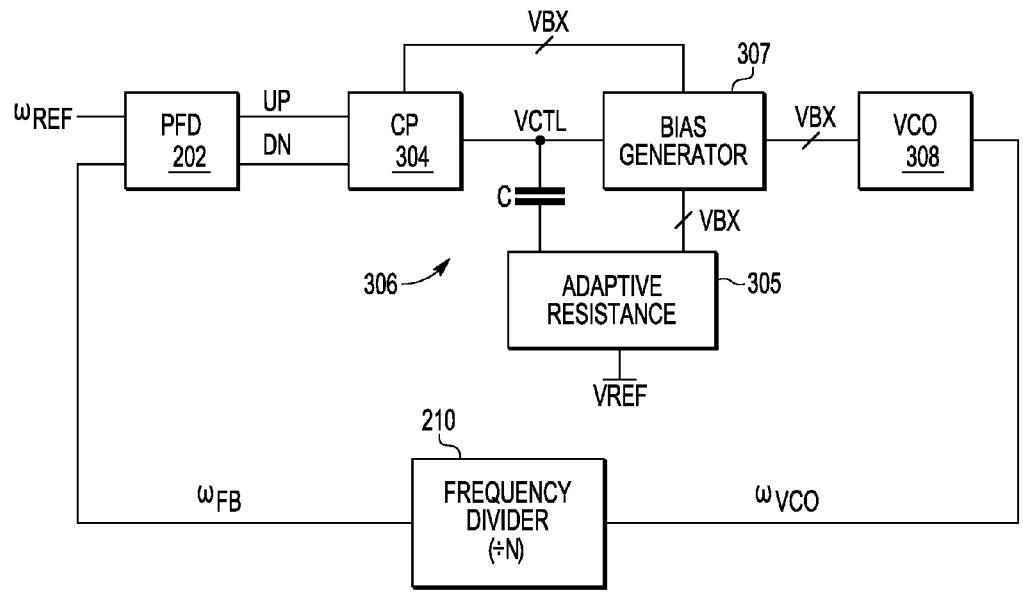
FIG. 3 is a simplified block and schematic diagram of a PLL implemented according to one embodiment.

FIG. 3 is a simplified schematic and block diagram of a PLL 300 implemented according to one embodiment. Similar components as those used in the conventional PLL 200 assume similar reference numerals. As shown, the PLL 300 includes the PFD 202 and the frequency divider 210, which are coupled to operate in substantially the same manner as described for the PLL 200. The CP 204 is replaced by CP 304, the loop filter 206 is replaced by an adaptive loop filter 306, and the VCO 208 is replaced by a VCO 308. The adaptive loop filter 306 is implemented with the loop filter capacitor C (with capacitance C) and an adaptive resistance 305 which generally replaces the loop filter resistor R. The adaptive resistance 305 is shown in series with the capacitor C, although the adaptive filter may be implemented to be located in alternative locations to perform a similar function. A bias generator 307 is provided which provides one or more bias voltages "VBX" to the CP 304, the adaptive resistance 305, and the VCO 308. As further described herein, VBX represents one or more bias voltages, such as VBP and/or VBN, which are based on a loop bias current (e.g., $I_{BIAS}$) developed within the bias generator 307 and used to develop proportional currents within the CP 304 (e.g., $I_{CP}$), the adaptive resistance 305 (e.g., $I_{M2}$), and the VCO 308 (e.g., $I_{VCO}$) as further described herein.

The PFD 202 of the PLL 300 operates in substantially the same manner by comparing the phase and frequency of signals $\omega_{REF}$ and $\omega_{FB}$ and generating at least one adjust signal to adjust phase and frequency of $\omega_{FB}$ in an attempt to match that of $\omega_{REF}$. In the illustrated embodiment, the PFD 202 generates the UP and DOWN signals for the phase and frequency adjustment. The UP and DN signals are both provided to respective inputs of the CP 304, which operates in similar manner as the CP 204 to develop the control voltage VCTL. The charge current of the CP 304, however, is adjusted based on the one or more bias voltages VBX as further described herein. The adaptive resistance 305 replaces the loop filter resistor R and adaptively adjusts loop filter resistance based on the one or more bias voltages VBX as further described herein. The bias generator 307 develops the one or more bias voltages VBX based on VCTL as further described herein. The VCO 308 operates in similar manner as the VCO 208, except that it is responsive to one or more bias voltages VBX rather than VCTL. As further described herein, the bias generator 307 generates the bias voltage(s) VBX based on VCTL so that the VCO generates $\omega_{VCO}$ indirectly based on VCTL. Thus, the VCO 308 generally adjusts the output frequency signal $\omega_{VCO}$ based on VCTL, which is divided down by the voltage divider 210 to develop the feedback frequency signal $\omega_{FB}$. In this manner, the PLL 300 also generally operates to generate $\omega_{VCO}$ such that $\omega_{VCO}=N\cdot\omega_{REF}$.

Figure 4:
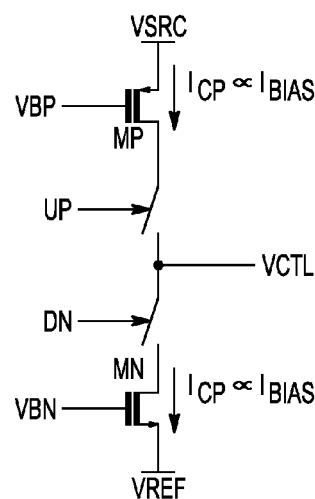
FIG. 4 is a schematic diagram of a charge pump according to one embodiment which may be used as the charge pump of FIG. 3.

FIG. 4 is a schematic diagram of a charge pump 400 implemented according to one embodiment which may be used as the charge pump CP 304. The charge pump 400 includes a P-type device MP, an N-type device MN, and a pair of switches S1 and S1 coupled in series between a source voltage VSRC and VREF. The devices MP and MN may each be implemented as a metal-oxide semiconductor (MOS) transistor, such as using PMOS and NMOS transistors. The switches S1 and S2 are each figuratively shown as single-pole, single throw (SPST) switches each having switched terminals and a control terminal receiving either the UP signal or the DN signal. The switches S1 and S2 may be implemented using MOS transistors or the like. As shown, the source of MP is coupled to VSRC and its drain is coupled to one switched terminal of S1. The other switched terminal of S1 is coupled to one switched terminal of S2 at the node developing VCTL. The other switched terminal of S2 is coupled to the drain of MN, having its source coupled to VREF. The gate of MP receives a first bias voltage VBP and the gate of MN receives a second bias voltage VBN, where VBX includes VBP and VBN in the illustrated embodiment. Switch S1 is controlled by the UP signal and switch S2 is controlled by the DN signal.

MP and MN are shown developing a charge pump current $I_{CP}$, which represents the charge/discharge current for the charge pump CP 400. In operation, when UP is asserted high and DN is asserted low, switch S1 is closed while S2 is opened so that charge pump current $I_{CP}$ flows to its output to charge the loop filter capacitor C to increase the voltage level of VCTL. When DN is asserted high and UP is asserted low, switch S2 is closed while S1 is opened so that charge pump current $I_{CP}$ is drawn from its output to discharge the loop filter capacitor C to decrease the voltage of VCTL. The bias generator 307 develops the bias voltages VBP and VBN to adjust the charge pump current $I_{CP}$. As shown, the charge pump current $I_{CP}$ is proportional to a loop bias current $I_{BIAS}$ (i.e., $I_{CP} \propto I_{BIAS}$) developed within the bias generator 307 as further described herein.

Figure 5:
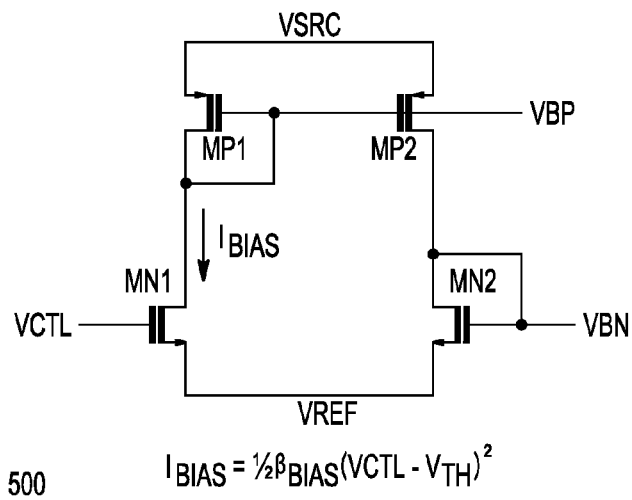
FIG. 5 is a schematic diagram of a bias generator according to one embodiment which may be used as the bias generator of FIG. 3.

FIG. 5 is a schematic diagram of a bias generator 500 according to one embodiment which may be used as the bias generator 307. The bias generator 500 includes 2 PMOS transistors MP1 and MP2 and 2 NMOS transistors MN1 and MN2. The sources of MP1 and MP2 are coupled to the source voltage VSRC and their gates are coupled together at a common node developing the bias voltage VBP. MP1 (diode-coupled) has its gate coupled to its drain which is further coupled to the drain of MN1. VCTL is provided to the gate of MN1, and the source of MN1 is coupled to VREF. The drain of MP2 is coupled to the drain and gate of MN2 (diode-coupled), and the source of MN2 is coupled to VREF. The drain/gate of MN2 develops the bias voltage VBN.

Figure 6:
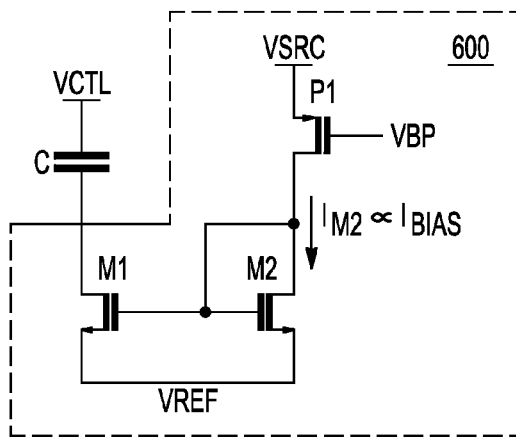
FIG. 6 is a simplified schematic and block diagram of an adaptive resistance according to one embodiment which may be used as the adaptive resistance of FIG. 3.

FIG. 6 is a simplified schematic and block diagram of an adaptive resistance 600 according to one embodiment coupled to the loop filter capacitor C, in which the adaptive resistance 600 which may be used as the adaptive resistance 305. The adaptive resistance 600 includes a PMOS transistor P1 and two NMOS transistors M1 and M2. P1 has its source coupled to the source voltage VSRC and its gate receiving the bias voltage VBP. The drain of P1 is coupled to the drain and gate of M2 (diode-coupled), which has its source coupled to VREF. The drain/gate of M2 is coupled to the gate of M1, and M1 has its source coupled to VREF. The drain of M1 is coupled to one end of the capacitor C, which has its other end coupled to the node developing VCTL. The loop filter current $I_{M2}$ flowing from the drain of P1 to the drain/gate of M2 is proportional to a loop bias current $I_{BIAS}$ as further described herein.

M1 is biased in its triode (or ohmic) region and thus generates an adaptive loop filter resistance $R_{ADP}$ which replaces the conventional loop filter resistor R. M1 is driven by M2, which is diode-coupled and biased by a loop filter current $I_{M2}$, which is provided from the bias generator 307 which also drives the proportional charge pump and/or bias currents $I_{CP}$ and $I_{VCO}$ based on the loop bias current $I_{BIAS}$.

Figure 7:
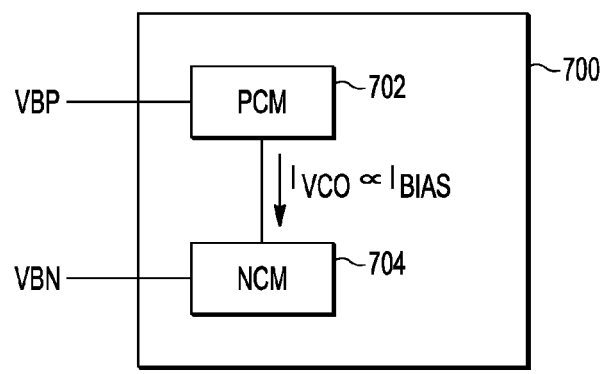
FIG. 7 is a simplified block diagram of a simplified bias portion of an exemplary VCO according to one embodiment which may be used as the VCO of FIG. 3.

FIG. 7 is a simplified block diagram of a simplified bias portion of an exemplary VCO 700 according to one embodiment which may be used as the VCO 308. The VCO 700 may be implemented in any suitable manner, such as a ring oscillator or the like in which the bias current in the VCO stages (not shown) is obtained by or otherwise based on at least one VCO bias current developed within the bias portion. In the illustrated embodiment, the bias portion of the VCO 700 includes a P-type current mirror (PCM) 702 biased by VBP and an N-type current mirror (NCM) 704 biased by VBN. Although additional components are included but not shown, the PCM 702 and the NCM 704 generate at least one VCO bias current $I_{VCO}$ within the VCO 700 which is ultimately used to develop $\omega_{VCO} = N \cdot \omega_{REF}$ as previously described.

The loop bias current $I_{BIAS}$ may be determined according to the following equation 1:

$$I_{BIAS} = \frac{1}{2} \cdot \beta_{BIAS} \cdot (VCTL - V_{TH})^2 \tag{1}$$

where $\beta_{BIAS}$ is the device transconductance of the bias generator 500 and $V_{TH}$ is the threshold voltage of the MOS devices, such as the threshold voltage of MN1. The bias voltages VBP and VBN configure the charge pump current $I_{CP}$, the loop filter current $I_{M2}$ within the adaptive resistance 305, and the VCO bias current $I_{VCO}$ of the VCO 308 to each be proportional to $I_{BIAS}$ according to the following equation 2:

$$I_{CP}, I_{M2}, I_{VCO} \propto I_{BIAS} \tag{2}$$

The relative factors of proportionality between the currents $I_{CP}, I_{M2}, I_{VCO}$ and $I_{BIAS}$ may be determined, at least in part, by the relative size of the PMOS and NMOS transistors used within the CP 304, the adaptive resistance 305, the VCO 308, and the bias generator 307.

The adaptive resistance $R_{ADP}$ of the adaptive resistance 600 replacing the loop filter resistor R may be determined according to the following equation 3:

$$R_{ADP} = \frac{1}{\beta_{M1}(V_{GS1} - V_{TH})} = \frac{1}{\beta_{M1}(V_{GS2} - V_{TH})} = \frac{1}{\beta_{M1}} \cdot \sqrt{\frac{\beta_{M2}}{2 \cdot I_{M2}}} \propto \sqrt{\frac{1}{I_{M2}}} \tag{3}$$

where $\beta_{M1}$ is the device transconductance of M1, $V_{GS1}$ is the gate-source voltage of M1, $V_{TH}$ is the threshold voltage of M1, $V_{GS2}$ is the gate-source voltage of M2, and $\beta_{M2}$ is the device transconductance of M2. The output frequency signal $\omega_{VCO}$ of the VCO 700 may be stated according to the following equation 4:

$$\omega_{VCO} = \frac{\sqrt{2 \cdot \beta_{VCO} \cdot I_{VCO}}}{C_B} \propto \frac{\sqrt{\beta_{VCO} \cdot \beta_{BIAS}}}{C_B} \cdot (VCTL - V_{TH}) \tag{4}$$

where $\beta_{VCO}$ is the device transconductance of the VCO 700 (or of each stage of the VCO) and $C_B$ is the total output capacitance of the VCO 700 (or of all stages of the VCO). The gain $K_{VCO}$ of the VCO 700 may be expressed according to the following equation 5:

$$K_{VCO} \propto \frac{\sqrt{\beta_{VCO} \cdot \beta_{BIAS}}}{C_B} \tag{5}$$

Using linear approximation, the loop gain $K_{PLL}$ of the PLL 300 may be determined according to the following equation 6:

$$K_{PLL} = \frac{I_{CP} \cdot R_{ADP} \cdot K_{VCO}}{2\pi \cdot N} \tag{6}$$

The operating frequency $\omega_{REF}$ of the PLL 300 may be determined according to the following equation 7:

$$\omega_{REF} = \frac{\omega_{VCO}}{N} \tag{7}$$

Thus, the ratio of the loop gain $K_{PLL}$ and frequency of the operating frequency signal $\omega_{REF}$ (in which this ratio is referred to as the "tracking bandwidth") may be determined according to the following equation 8:

$$\frac{K_{PLL}}{\omega_{REF}} = \frac{\frac{I_{CP}}{2\pi \cdot N} \cdot R_{ADP} \cdot K_{VCO}}{\frac{\omega_{VCO}}{N}} \propto \frac{I_{CP}}{\sqrt{I_{M2}}} \cdot \frac{1}{\sqrt{I_{VCO}}} \rightarrow \text{CONSTANT} \quad (8)$$

in which "CONSTANT" means that the ratio of the loop gain to operating frequency is constant. In this manner, tracking bandwidth is achieved by the PLL 300. The damping ratio for the PLL 300 may be determined according to the following equation 9:

$$\zeta = \frac{1}{2} \cdot R_{ADP} \cdot \sqrt{\frac{I_{CP} \cdot K_{VCO} \cdot C}{2\pi \cdot N}} \propto \frac{\sqrt{I_{CP}}}{\sqrt{I_{M2}}} \rightarrow \text{CONSTANT} \quad (9)$$

so that the damping ratio $\zeta$ is also a constant value. Since the damping ratio $\zeta$ is a constant value, the PLL 300 exhibits a stable and relatively fast response.

Since tracking bandwidth is achieved by the PLL 300 and the damping ratio is constant, the PLL 300 exhibits relatively low power, low jitter, and a broad operating frequency range. The tracking bandwidth is independent of the MOS process used to fabricate the PLL.

In summary, the loop filter is replaced by an adaptive loop filter. For the adaptive loop filter, the loop filter resistor is replaced by an adaptive resistance $R_{ADP}$ having a resistance adjusted by a loop filter current (e.g., $I_{M2}$) provided by a bias generator (e.g., 500). In one embodiment, the adaptive resistance is implemented as a MOS device (e.g., M1) operating in its triode region which is driven by a diode-coupled MOS device (e.g., M2) responsive to the loop filter current to develop the adaptive loop resistance $R_{ADP}$. The loop filter current is generated by a bias generator which develops a loop bias current (e.g., $I_{BIAS}$) responsive to the loop control voltage VCTL. The bias generator generates a charge pump current (e.g., $I_{CP}$), the loop filter current, and a VCO bias current (e.g., $I_{VCO}$) to each be proportional to the loop bias current, and thus proportional to each other. The tracking bandwidth, determined as the ratio of PLL loop gain and operating frequency, depends only upon the charge pump current, the loop filter current and the VCO bias current as illustrated by equation 8 and thus is constant. The damping ratio depends only on the charge current and the loop filter current as illustrated by equation 9 and thus is also constant. In this manner, PLL jitter is minimized. The simplicity of the adaptive loop filter including an adaptive resistance achieve minimized jitter while further reducing power consumption, silicon area, and circuit complexity as compared to alternative methods.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims. Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A phase locked loop, comprising:
    a feedback circuit which provides a feedback signal based on an output signal, and a phase detector which generates at least one adjust signal based on a frequency of said feedback signal compared with a reference frequency;
    a charge pump receiving said at least one adjust signal and having an output coupled to a control node providing a control voltage;
    a capacitor and an adaptive resistance coupled in series between said control node and a reference node, wherein said adaptive resistance includes at least one current control input;
    a voltage controlled oscillator having an output providing said output signal based on a voltage level of said control voltage;
    a bias generator which converts said control voltage to a loop bias current, and which has at least one bias output which is based on said loop bias current and which is coupled to said at least one current control input of said adaptive resistance; and
    wherein said bias generator provides a bias voltage, and wherein said adaptive resistance comprises:
        a first transistor having a source coupled to a source voltage, having a gate receiving said bias voltage, and having a drain;
        a second transistor having a drain and gate coupled to said drain of said first transistor and having a source coupled to said reference node; and
        a third transistor having a drain coupled to said capacitor, having a gate coupled to said gate of said second transistor, and having a source coupled to said reference node.

2. The phase locked loop of claim 1, wherein said at least one bias output is coupled to at least one current control input of each of said charge pump and said voltage controlled oscillator.

3. The phase locked loop of claim 2, wherein said charge pump develops a charge pump current based on said at least one current control input of said charge pump, wherein said adaptive resistance develops a loop filter current based on said at least one current control input of said adaptive resistance, wherein said voltage controlled oscillator develops a voltage controlled oscillator bias current based on said at least one current control input of said voltage controlled oscillator, and wherein said charge pump current, said loop filter current, and said voltage controlled oscillator bias current are each proportional to said loop bias current.

4. The phase locked loop of claim 1, wherein said loop bias current is proportional to a transconductance gain of said bias generator multiplied by a square of a difference between said control voltage and a MOS device threshold voltage.

5. The phase locked loop of claim 1, wherein said adaptive resistance comprises a MOS transistor operating in its triode region.

6. The phase locked loop of claim 1, wherein a loop filter current developed through said first and second transistors is proportional to said loop bias current, and wherein said third transistor operates in its triode region.

7. The phase locked loop of claim 1, wherein said first transistor comprises a PMOS transistor, and wherein said second and third transistors comprise NMOS transistors.

8. The phase locked loop of claim 1, wherein a ratio of loop gain of said phase locked loop and said reference frequency is constant and wherein a damping ratio of said phase locked loop is constant.

9. The phase locked loop of claim 1, wherein:
said bias generator comprises transistors forming a P-type bias node and an N-type bias node; and
wherein said charge pump comprises a first transistor and a second transistor having current terminals coupled in series between a source voltage and said reference node, wherein said first transistor has a gate coupled to said P-type bias node and wherein said second transistor has a gate coupled to said N-type bias node.

10. The phase locked loop of claim 1, wherein:
said bias generator comprises transistors forming a P-type bias node and an N-type bias node; and
wherein said voltage controlled oscillator comprises a P-type current mirror coupled to said P-type bias node and an N-type current mirror coupled to said N-type bias node.

11. The phase locked loop of claim 1, wherein said phase locked loop is provided within a timing block coupled to a processor and a memory.

12. A phase locked loop, comprising:
a feedback circuit which provides a feedback signal based on an output signal, and a phase detector which generates at least one adjust signal based on a frequency of said feedback signal compared with a reference frequency;
a charge pump receiving said at least one adjust signal and having an output coupled to a control node providing a control voltage;
a capacitor and an adaptive resistance coupled in series between said control node and a reference node, wherein said adaptive resistance includes at least one current control input;
a voltage controlled oscillator having an output providing said output signal based on a voltage level of said control voltage;
a bias generator which converts said control voltage to a loop bias current, and which has at least one bias output which is based on said loop bias current and which is coupled to said at least one current control input of said adaptive resistance, wherein said bias generator comprises:
a first transistor having a source coupled to a source voltage and having a drain and gate coupled together at a first bias node;
a second transistor having a source coupled to said source voltage, having a gate coupled to said first bias node, and having a drain;
a third transistor having a drain coupled to said drain of said first transistor, having a gate coupled to said control node, and having a source coupled to said reference node; and
a fourth transistor having a drain and gate coupled together to said drain of said second transistor at a second bias node, and having a source coupled to said reference node; and wherein said adaptive resistance comprises:
a fifth transistor having a source coupled to a source voltage, having a gate coupled to said first bias node, and having a drain;
a sixth transistor having a drain and gate coupled to said drain of said fifth transistor and having a source coupled to said reference node; and
a seventh transistor having a drain coupled to said capacitor, having a gate coupled to said gate of said sixth transistor, and having a source coupled to said reference node.

13. The phase locked loop of claim of claim 12, wherein said first and second transistors comprise PMOS transistors, and wherein said third and fourth transistors comprise NMOS transistors.

14. The electronic device of claim 12, wherein said charge pump comprises an eighth transistor and a ninth transistor having current terminals coupled in series between a source voltage and said reference node, wherein said eighth transistor has a gate coupled to said first bias node and wherein said ninth transistor has a gate coupled to said second bias node.

15. A method of adaptively filtering a phase lock loop including a feedback circuit and a phase detector, wherein the feedback circuit converts an output signal to a feedback signal, and wherein the phase detector generates at least one adjust signal based on a frequency of the feedback signal compared with a reference frequency, said method comprising:
selectively adjusting a control voltage based on the at least one adjust signal;
converting the control voltage to a loop bias current comprising multiplying a transconductance gain by a square of a difference between the control voltage and a MOS device threshold voltage;
adaptively filtering the control voltage using an adaptive resistance, wherein the adaptive resistance is configured as a first MOS device operating in its triode region controlled by a second diode-coupled MOS device using a loop filter current which is proportional to the loop bias current; and
generating the output signal having a frequency based on a voltage level of the control voltage.

16. The method of claim 15, wherein said selectively adjusting a control voltage comprises developing a charge current proportional to the loop bias current and charging and discharging a capacitive circuit using the charge current.

17. The method of claim 15, wherein said generating the output signal comprises adjusting the frequency of the output signal based on a voltage controlled oscillator bias current which is proportional to the loop bias current.

* * * * *